US009508812B2

(12) United States Patent
Schulze et al.

(10) Patent No.: US 9,508,812 B2
(45) Date of Patent: *Nov. 29, 2016

(54) SEMICONDUCTOR DEVICE

(71) Applicant: Infineon Technologies Austria AG, Villach (AT)

(72) Inventors: Hans-Joachim Schulze, Taufkirchen (DE); Stephan Voss, Munich (DE); Markus Zundel, Egmating (DE)

(73) Assignee: Infineon Technologies Austria AG, Villach (AT)

( * ) Notice: Subject to any disclaimer, the term of this patent is extended or adjusted under 35 U.S.C. 154(b) by 60 days.

This patent is subject to a terminal disclaimer.

(21) Appl. No.: 14/482,317

(22) Filed: Sep. 10, 2014

(65) Prior Publication Data

US 2015/0028412 A1 Jan. 29, 2015

Related U.S. Application Data

(60) Division of application No. 12/640,532, filed on Dec. 17, 2009, now Pat. No. 8,866,255, which is a continuation-in-part of application No. 12/046,760, filed on Mar. 12, 2008, now Pat. No. 8,809,966.

(51) Int. Cl.
| | |
|---|---|
| *H01L 29/00* | (2006.01) |
| *H01L 29/423* | (2006.01) |
| *H01L 27/02* | (2006.01) |
| *H01L 29/06* | (2006.01) |
| *H01L 29/417* | (2006.01) |
| *H01L 29/78* | (2006.01) |

(Continued)

(52) U.S. Cl.
CPC ....... *H01L 29/4236* (2013.01); *H01L 27/0207* (2013.01); *H01L 29/0649* (2013.01); *H01L 29/407* (2013.01); *H01L 29/41741* (2013.01); *H01L 29/41775* (2013.01); *H01L 29/4238* (2013.01); *H01L 29/42372* (2013.01); *H01L 29/51* (2013.01); *H01L 29/78* (2013.01); *H01L 29/7811* (2013.01); *H01L 29/7813* (2013.01); *H01L 29/0696* (2013.01); *H01L 29/402* (2013.01)

(58) Field of Classification Search
CPC ............. H01L 29/407; H01L 29/78; H01L 29/41741; H01L 29/42372; H01L 29/4238; H01L 29/7811; H01L 29/7813; H01L 29/41775; H01L 29/0696; H01L 29/402; H01L 29/4236; H01L 29/0649; H01L 29/51; H01L 27/0207
USPC .......................................................... 257/330
See application file for complete search history.

(56) References Cited

U.S. PATENT DOCUMENTS

| | | |
|---|---|---|
| 5,355,008 A | 10/1994 | Moyer et al. |
| 5,763,915 A | 6/1998 | Hshieh et al. |

(Continued)

OTHER PUBLICATIONS

Non-Final Office Action mailed Jan. 5, 2012 in U.S. Appl. No. 12/046,760.

(Continued)

*Primary Examiner* — Victoria K Hall
(74) *Attorney, Agent, or Firm* — Dicke, Billig & Czaja, PLLC

(57) ABSTRACT

A semiconductor device is provided that comprises a semiconductor substrate comprising an active area and a peripheral region adjacent the active area and structure positioned in the peripheral region for hindering the diffusion of mobile ions from the peripheral region into the active area.

14 Claims, 7 Drawing Sheets

(51) Int. Cl.
  *H01L 29/51* (2006.01)
  *H01L 29/40* (2006.01)

(56) References Cited

U.S. PATENT DOCUMENTS

| | | | |
|---|---|---|---|
| 5,780,364 A | 7/1998 | Thakur | |
| 5,831,330 A * | 11/1998 | Chang | H01L 23/585 |
| | | | 257/619 |
| 5,973,360 A | 10/1999 | Tihanyi | |
| 5,973,361 A | 10/1999 | Hshieh et al. | |
| 5,977,609 A | 11/1999 | Soderbarg et al. | |
| 5,986,281 A | 11/1999 | Burchanowski et al. | |
| 6,057,558 A | 5/2000 | Yamamoto et al. | |
| 6,104,060 A | 8/2000 | Hshieh et al. | |
| 6,133,610 A | 10/2000 | Bolam et al. | |
| 6,348,808 B1 | 2/2002 | Yakura | |
| 6,404,025 B1 | 6/2002 | Hshieh et al. | |
| 6,429,502 B1 | 8/2002 | Librizzi et al. | |
| 6,603,173 B1 | 8/2003 | Okabe et al. | |
| 6,696,726 B1 | 2/2004 | Bencuya et al. | |
| 6,897,561 B2 | 5/2005 | Nemtsev et al. | |
| 6,977,416 B2 | 12/2005 | Nakazawa et al. | |
| 7,132,712 B2 | 11/2006 | Kocon et al. | |
| 7,211,862 B2 | 5/2007 | Nakazawa et al. | |
| 7,304,356 B2 | 12/2007 | Takahashi | |
| 7,307,315 B2 | 12/2007 | Wu | |
| 7,348,244 B2 | 3/2008 | Aoki et al. | |
| 7,582,519 B2 | 9/2009 | Kocon et al. | |
| 7,652,326 B2 | 1/2010 | Kocon | |
| 7,855,415 B2 | 12/2010 | Challa et al. | |
| 7,880,225 B2 | 2/2011 | Matsuura et al. | |
| 7,999,312 B2 | 8/2011 | Takaya et al. | |
| 8,013,387 B2 | 9/2011 | Yedinak et al. | |
| 8,044,460 B2 | 10/2011 | Hirler et al. | |
| 8,084,865 B2 | 12/2011 | Hirler et al. | |
| 8,809,966 B2 * | 8/2014 | Zundel | H01L 29/407 |
| | | | 257/401 |
| 2002/0030224 A1 | 3/2002 | Hshieh et al. | |
| 2002/0167071 A1 | 11/2002 | Wang | |
| 2003/0178676 A1 * | 9/2003 | Henninger | H01L 29/402 |
| | | | 257/340 |
| 2003/0222297 A1 * | 12/2003 | Krumrey | H01L 29/407 |
| | | | 257/302 |
| 2005/0032287 A1 | 2/2005 | Nakazawa et al. | |
| 2005/0082591 A1 | 4/2005 | Hirler et al. | |
| 2005/0167742 A1 * | 8/2005 | Challa | H01L 21/3065 |
| | | | 257/328 |
| 2006/0055002 A1 | 3/2006 | Yao et al. | |
| 2006/0076651 A1 * | 4/2006 | Tsutsue | H01L 23/562 |
| | | | 257/620 |
| 2007/0221950 A1 | 9/2007 | Suzuki et al. | |
| 2007/0293042 A1 | 12/2007 | Kim et al. | |
| 2008/0061403 A1 | 3/2008 | He et al. | |
| 2008/0128803 A1 | 6/2008 | Hirler et al. | |
| 2008/0179672 A1 * | 7/2008 | Hirler | H01L 29/404 |
| | | | 257/342 |
| 2008/0179710 A1 | 7/2008 | Yip et al. | |
| 2008/0265427 A1 * | 10/2008 | Hirler | H01L 29/7811 |
| | | | 257/773 |
| 2008/0277765 A1 | 11/2008 | Lane et al. | |
| 2009/0079002 A1 * | 3/2009 | Lee | H01L 29/66712 |
| | | | 257/355 |
| 2009/0108338 A1 * | 4/2009 | Hshieh | H01L 29/0878 |
| | | | 257/328 |
| 2009/0230561 A1 | 9/2009 | Zundel | |
| 2010/0140697 A1 * | 6/2010 | Yedinak | H01L 29/0692 |
| | | | 257/334 |
| 2010/0155879 A1 | 6/2010 | Schulze et al. | |

OTHER PUBLICATIONS

Non-Final Office Action mailed May 8, 2013 in U.S. Appl. No. 12/640,532.
Final Office Action mailed Nov. 5, 2013 in U.S. Appl. No. 12/640,532.
Final Office Action mailed Nov. 6, 2012 in U.S. Appl. No. 12/640,532.

* cited by examiner

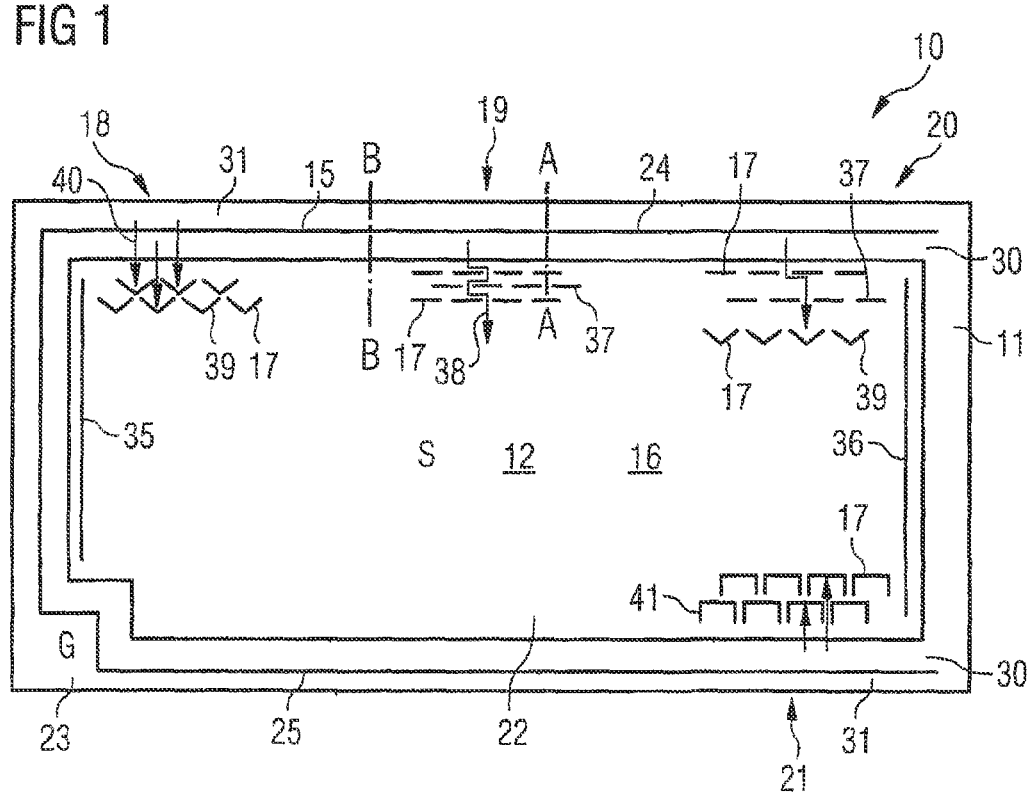

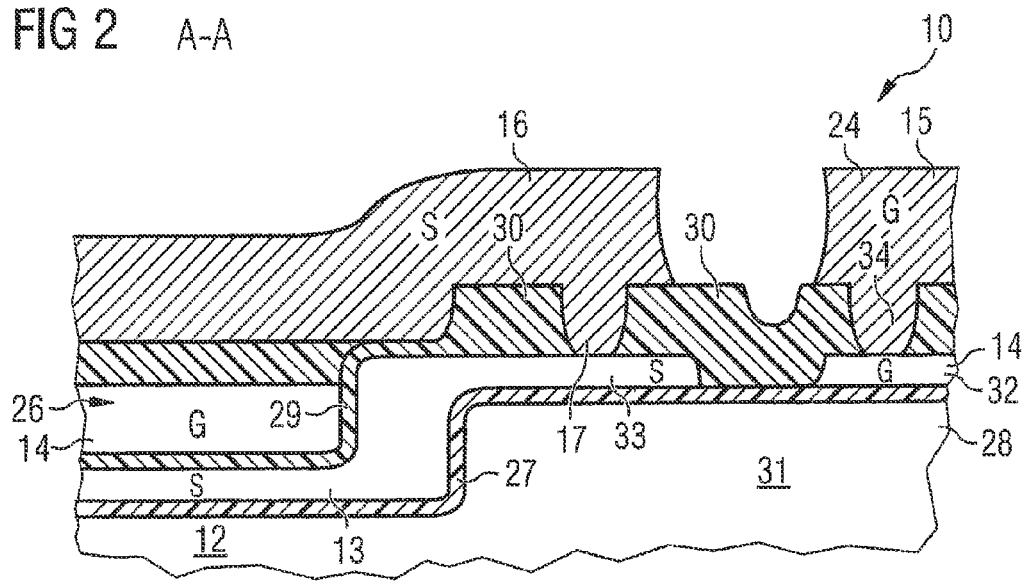
FIG 2  A-A
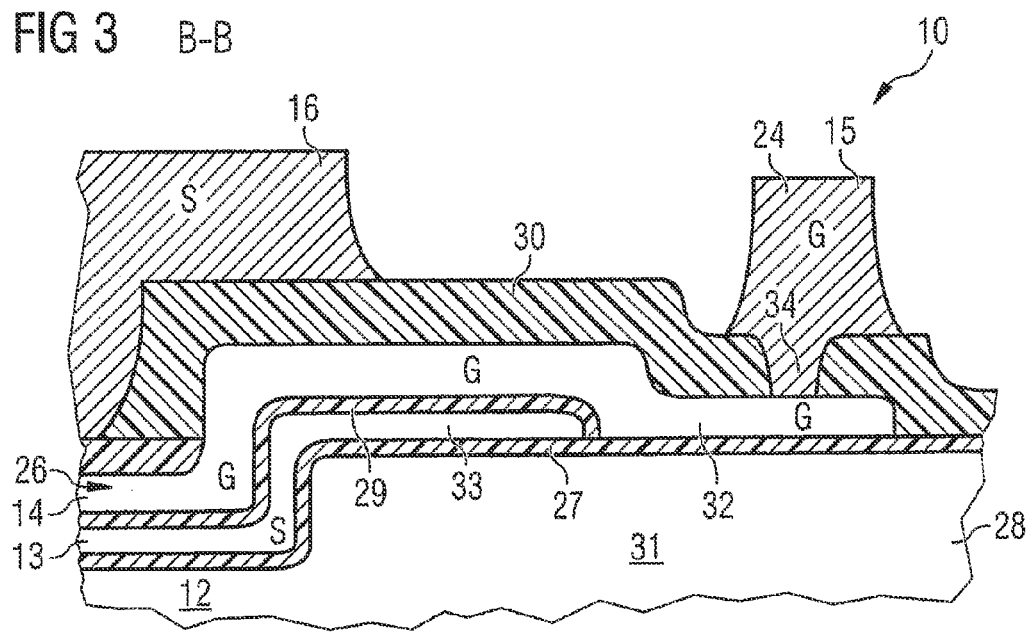
FIG 3  B-B

C-C

C-C

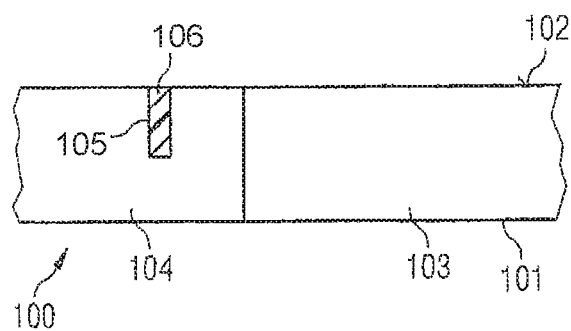
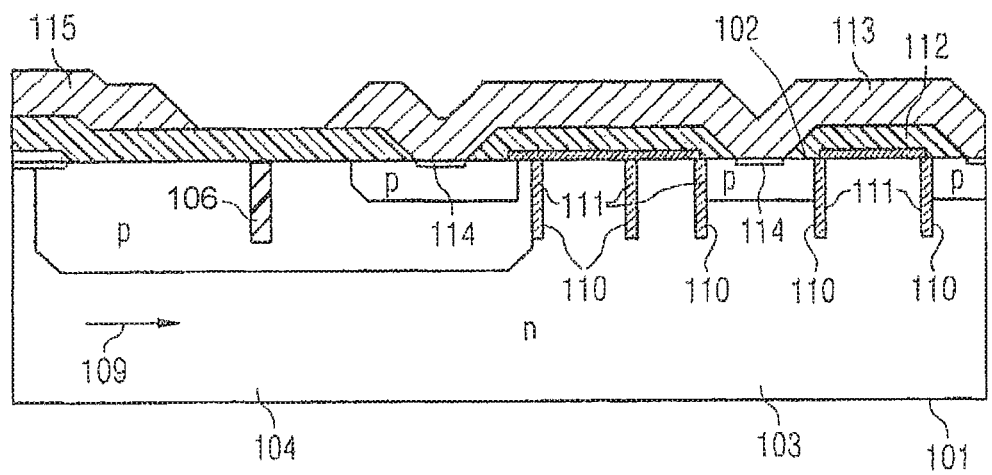

SEMICONDUCTOR DEVICE

CROSS-REFERENCE TO RELATED APPLICATIONS

This Utility Patent Application is a divisional application of U.S. application Ser. No. 12/640,532, filed Dec. 17, 2009, which is a continuation-in-part application of U.S. application Ser. No. 12/046,760, filed Mar. 12, 2008 all of which are incorporated herein by reference. U.S. application Ser. No. 14/339,923, filed Jul. 24, 2014 is a divisional of U.S. application Ser. No. 12/046,760 and is also incorporated herein by reference.

BACKGROUND

Contamination of semiconductor devices by mobile ions such as $Na^+$, $K^+$, $Fe^+$ etc. introduced during the manufacturing process is an issue in semiconductor device manufacturing. Whenever an electric field is maintained across a silicon oxide layer for long periods of time, contaminating mobile ions migrate towards an interface between the silicon oxide and neighboring material such as silicon. For example, in MOS field effect transistors, the mobile ions tend to accumulate at the junction between the gate oxide and the underlying silicon channel region. The contamination can over time eventually build up to a point where the threshold voltage of the device is noticeably affected which is undesirable.

For these and other reasons, there is a need for the present invention.

SUMMARY

A semiconductor device is provided that comprises a semiconductor substrate comprising an active area and a peripheral region adjacent the active area and means for hindering the diffusion of mobile ions from the peripheral region into the active area, the means being positioned in the peripheral region.

A semiconductor device is provided which has an active area including plurality of first trenches with a gate electrode positioned in the first trenches and a peripheral region positioned adjacent the active area. A plurality of electrically conductive members are positioned in the peripheral region. A source metal contact is positioned above and forms an electrical contact with the source and the plurality of electrically conductive members.

A semiconductor device is provided which has a semiconductor substrate having a first major surface; an active area and an edge region surrounding the active area. At least one trench is positioned in the edge region that at least substantially surrounds the active area. The trench is at least partially filled with dielectric material.

BRIEF DESCRIPTION OF THE DRAWINGS

The accompanying drawings are included to provide a further understanding and are incorporated in and constitute a part of this specification. The drawings illustrate the embodiments and together with the description serve to explain the principles of the invention. Other embodiments and many of the intended advantages will be readily appreciated as they become better understood by reference to the following detailed description. The elements of the drawings are not necessarily to scale relative to each other. Like reference numerals designate corresponding similar parts.

FIG. 1 illustrates a plan view of a semiconductor device.

FIG. 2 illustrates a cross-sectional view along the line A-A of semiconductor device of FIG. 1.

FIG. 3 illustrates a cross-sectional view along the line B-B of the semiconductor device of FIG. 1.

FIG. 9 illustrates a cross-sectional view of a semiconductor device.

FIG. 10 illustrates a cross-sectional view of a semiconductor device.

DETAILED DESCRIPTION

Figure 4:
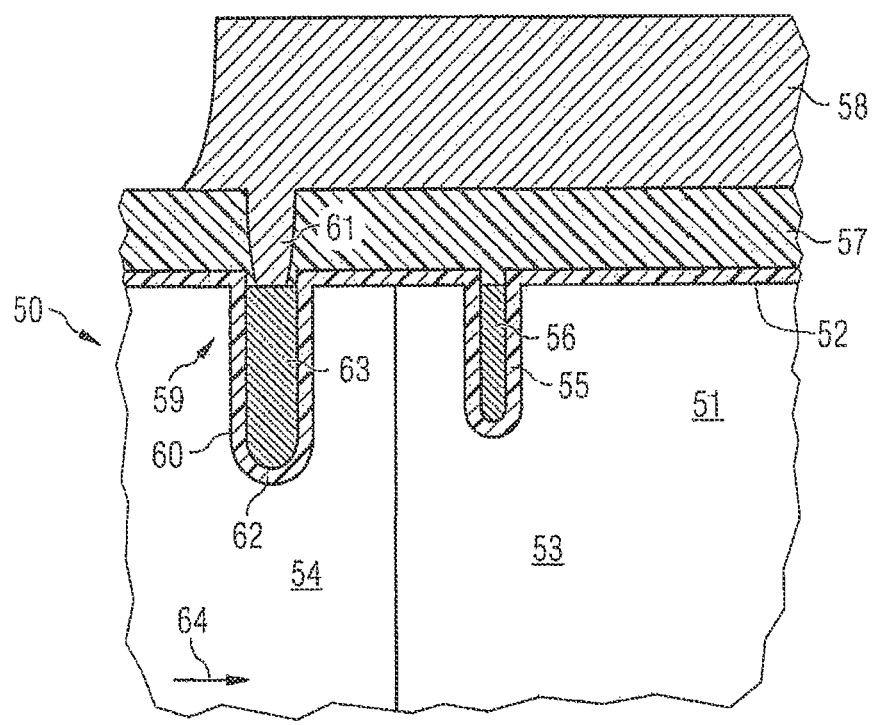
FIG. 4 illustrates a cross-sectional view of a semiconductor device.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

FIG. 1 illustrates a plan view of a semiconductor device 10 and, in one embodiment, the top side 11 of the semiconductor device 10. FIGS. 2 and 3 illustrate cross-sectional views along the lines A-A and B-B, respectively, indicated in FIG. 1.

The semiconductor device 10 includes an active area 12 including the cell field and a source electrode 13 and a gate electrode 14. The semiconductor device 10 further includes a gate metal contact 15 and a source metal contact 16. The source electrode 13 and gate electrode 14 of the active area 12 are illustrated in the cross-sectional views of FIGS. 2 and 3.

The source metal contact 16 is deposited above and forms an electrical contact with the source electrode 13. This is illustrated in the cross-sectional view of FIG. 2. The gate metal contact 15 is deposited above and forms an electrical contact with the gate electrode 14. This is illustrated in the cross-sectional view of FIG. 3. As used herein, above is used to denote a position not only directly over, but also positions adjacent the gate electrode 14 or source electrode 13, respectively.

The source metal contact 16 includes a plurality of through contacts 17 which are positioned adjacent a side of the active area 12. The plurality of metal through contacts 17 are spaced at intervals from one another and arranged in two or more rows. The spatial arrangement of the plurality of metal through contacts 17 is illustrated in the plan view of FIG. 1. In one embodiment, FIG. 1 illustrates four embodiments of arrangements of the metal through contacts 17 indicated generally by reference numbers 18, 19, 20 and 21.

The semiconductor device 10 is, in this embodiment, a MOSFET device. The top side 11 of the semiconductor device 10 has a central region 22 in which the active area 12 is situated. The active area 12 is covered by the source metal contact 16. Both the semiconductor device 10 and source metal contact 16 have a generally rectangular form.

The top side 11 of a semiconductor device 10 also includes a gate metal contact 15 having a contact area 23 positioned in a corner of the top surface 11 as well as gate runners 24, 25 which extend from the gate contact area 23 along the two long sides of the semiconductor device 10 in the peripheral edge of regions 31 of the top side 11 of the semiconductor device 10. The gate runners 24, 25 are metal. The gate metal contact 15 and the source metal contact 16 may include aluminum and may have a layered structure of different metals or any known metal contact structure.

The gate runner 24 which is arranged in the peripheral edge region 31 opposing the corner in which the gate contact area 23 is arranged also extends along one short side of the semiconductor device 10 to the gate contact area 23. The gate metal contact 15 has a generally U-shaped form and surrounds the source metal contact 16 on three sides.

The gate runners 24, 25 as well as the gate metal contact area 23 are arranged adjacent and spaced at a distance from the source metal contact 16. The gate contact 15 is electrically isolated from the source metal contact 16 as well as from the source electrode 13 by an electrically insulating third oxide layer 30 positioned between the gate metal contact 15 and the source metal contact 16 and source electrode 13. The electrically insulating layer may be an oxide, a nitride or BPSG (Boron Phosphate Silicate Glass).

In other non-illustrated embodiments, the gate runner may extend along only the long sides of the active area 12 or on all four sides of the active area.

As is illustrated in the cross-sectional views of FIGS. 2 and 3, the source electrode 13 and gate electrode 14 of the active area 12 are positioned in a plurality of trenches providing the cell field of the active area 12. A portion of a single trench 26 is illustrated in FIGS. 2 and 3. The source electrode 13 and gate electrode 14 may include polysilicon. The source electrode 13 is positioned towards the bottom of the trench 26 and the gate electrode 14 is arranged on top of the source electrode 13 in the trench 26.

A first electrically insulating oxide layer 27 is arranged over the top surface of the doped silicon substrate 28 of the semiconductor device 10 to electrically insulate the source electrode 13 from the silicon substrate 28. A second oxide layer 29 is arranged over the source electrode 13 in the region of the trench 26 in order to electrically isolate the gate electrode 14 from the source electrode 13. A third oxide layer 30 having a substantially larger thickness is arranged on the gate electrode 14 and extends over the top side of the semiconductor device 10. In regions outside of the active area 12 the third oxide layer 30 has an even greater thickness.

FIG. 2 illustrates that in order to provide an electrical contact to the source electrode 13 positioned at the bottom of the trench 26, the source electrode 13 extends up the side of the trench 26 and into the peripheral region 31 of the semiconductor device 10. The peripheral region 31 surrounds the cell field of the active area 12.

FIG. 3 illustrates that the gate electrode 14 also extends into the peripheral region 31 and, more particularly, the end region 32 of the gate electrode 14 is positioned adjacent and outside of the end region 33 of the source electrode 13.

The end region 33 of the source electrode 13 and the end region 32 of the gate electrode 14 are positioned adjacent to one another and are electrically insulated from one another by the first oxide layer 27, the second oxide layer 29 and the third oxide layer 30 which cover the end region 33 of the source electrode 13 and end region 32 of the gate electrode 14.

The source metal contact 16 is electrically connected to be source electrode 13 by a plurality of through contacts 17 which extend between the source metal contact 16 through the third oxide layer 30 to the end region 33 of the source electrode 13 positioned adjacent the trench 26. Similarly, the gate metal contact 15 is electrically connected to the end region 32 of the gate electrode 14 by a through contact 34 which extends form the gate runner 24 through the third oxide layer 30 to the end region 32 of the gate electrode 14.

As is illustrated in the plan view of the top side 11 of the semiconductor device 10 in FIG. 1, the through contact 34 electrically connecting each of the gate runners 24, 25 to the gate electrode 14 is continuous along the length of the gate runner 24. In contrast, the source metal contact 16 is electrically connected to the end region 33 of the source electrode 13 by a plurality of metal through contacts 17 which are spaced at intervals from another and which are electrically insulated from one another by the third oxide layer 30.

The gate electrode 14 extends from the active area 12 into the peripheral region 31 of the semiconductor device 10 in regions of the top side 11 which are positioned between the metal through contacts 17 electrically connecting the source metal contact 16 to the source electrode 13. The gate electrode 14 is electrically isolated from the metal through contacts 17 by regions of the third oxide layer 30.

The plurality of metal through contacts 17 are arranged towards the peripheral edge of the source metal contact 16 and are positioned in two or more rows arranged one in front of another and generally parallel to a peripheral edge of the source metal contact 16 and to a side of the active area 12. The through contacts 17, in plan view, may have a variety of forms and arrangements.

In the plan view of the top side 11 of the semiconductor device 10, four embodiments of the metal through contacts 17 are illustrated. The four embodiments are illustrated as separate groups for ease of illustration. However, the plurality of through contacts 17 would in practice extend along the entire side of the source metal contact 16.

If the gate metal contact 15 includes only a single gate runner, the plurality of through contacts 17 would be positioned on only the side of the source metal contact 16 which is directly adjacent the gate runner. In the embodiment illustrated in FIG. 1, a gate runner 24, 25 extends on each of the two long sides of the source metal contact 10. In this embodiment, through contacts 17 are positioned on each of the two long sides of the source metal contact 16.

On the two short sides of the semiconductor device 10 and source metal contact 16 a single through contact 35, 36 extending from the source metal contact 16 to the end region 33 of the source electrode 13 is provided. The through contacts 35, 36 extend along the entire short side in contrast to the long side of the source metal contact 16 along which a plurality of metal through contacts 17 are arranged at intervals spaced from one another.

Mobile contaminate ions, such as $Na^+$, $K^+$ etc., diffuse extremely slowly through metals compared to oxides. In the arrangement illustrated in the drawings, these mobile contaminate ions can diffuse along the oxide layer 30 and into the active area 12. Over time, the contamination may build up in the active area 12 to a level such that the threshold voltage of the semiconductor device 10 is affected. The metal through contacts 35, 36 and 17 are arranged to provide a diffusion barrier hindering the migration of mobile ions along the third oxide layer 30 into the active area 12.

The long through contacts 35, 36 arranged on the two short sides provide a closed barrier to mobile ion diffusion along these two short sides. Although, in principle, a through contact having a closed ring form which entirely surrounds the active area 12 would provide a continuous diffusion barrier, this arrangement is not practicable if the gate electrode 14 is to be contacted at an end region 32 positioned outside the active area 12 and outside of the source metal contact 16.

In order that the gate electrode 14 can be led out to the peripheral edge 31 of the device 10, gaps in the through contact between the source metal contact 16 and the source electrode 13 are provided so that the gate electrode 14 can be positioned in these gaps, that is in the regions between the through contacts. In these regions, the third oxide layer 30 extends into the active area 12 and provides a path along which the mobile ions may diffuse into the active area 12.

In order to further hinder the diffusion of mobile ions along the third oxide layer 30 into the active area 12, the plurality of metal through contacts 17 are arranged in two or more rows. More particularly, the plurality of the contacts 17 may be provided, in plan view, with an elongate structure and the long direction may be positioned approximately parallel to the side of the source metal contact 16.

In one embodiment, the metal through contacts 17 of adjacent rows are arranged offset with respect to one another. This embodiment is illustrated in the group 19 with elongate metal through contacts 37. In the case of metal through contacts 37 having a generally rectangular form in plan view, the metal through contacts of one row are arranged so that their center is positioned between adjacent metal through contacts of the adjacent row to provide an offset arrangement. The arrangement of the through contacts of adjacent rows can also be described as a staggered arrangement.

The possible diffusion path for mobile contaminate ions through the third oxide layer 30 positioned between the elongated metal through contacts 37 is illustrated by the arrow 38 in FIG. 1. The possible diffusion path 38 has a meandering structure. The gate electrode 14 may extend to the peripheral area 31 in which the gate runner 24 is arranged by positioning it in these regions of the third oxide layer 31 between the metal through contacts 37. The gate electrode 14 may also extend in a meandering fashion between the through contacts 37 from the active area 12 to the gate runner 24 in the peripheral region 31 of the semiconductor device 10.

In an arrangement consisting of a single row of through contacts spaced at intervals the shortest direct path would generally be perpendicular to the side of the source metal contact 16. By arranging the metal through contacts 37 in two or more rows with an offset arrangement, the diffusion path takes on a meandering structure and the length of the diffusion path for the mobile ions is increased. Therefore, the time taken for contamination to build up in the active area 12 and to affect the threshold voltage and performance of the device is increased.

In one embodiment, the metal through contacts 17, in plan view, have a funnel shape. Two embodiments with metal through contacts having a funnel shape are illustrated in FIG. 1 and indicated generally by the reference numbers 18 and 21.

In the embodiment generally indicated with reference number 18, each of the through contacts 39 has a generally V-shape in plan view. The through contacts 39 are arranged in two rows such that the apex of the V points in the direction of the active area 12 and the open side faces towards the peripheral edge 31 of the semiconductor device 10.

The through contacts 39 of one row are offset with respect to the through contacts 39 of the other row so that the apex of the V of the through contacts 39 of the first row is positioned between two neighboring V-shaped through contacts 39 of the other row. This staggered arrangement of the V-shaped through contacts 39 enables the gate electrode 14 to extend in a meandering fashion between the through contacts 39 from the active area 12 to the peripheral area 31 in which the gate runner 24 is arranged.

The V-shaped form provides a trap for the mobile ions as indicated by the arrows 40. The mobile contaminate ions, such as $Na^+$ and $K^+$, migrate through the third oxide layer 30 along the shortest possible path which is approximately perpendicular to the side of the source metal contact 16. The mobile contaminate ions may enter the open end of the V-shaped through contact 39 and accumulate within the V-shaped form.

In a MOSFET device in which a more positive voltage, relative to the voltage of the source metal contact, is applied to the gate runner 24, positively charged mobile ions are encouraged away from the gate runner 24 and towards the cell field of the active area 12. Therefore, once the positively charged ions have entered the V-shaped through contact 39, they tend to be trapped there since to diffuse out of the V-shaped through contact 39 they would have to migrate against the favourable diffusion direction set by the voltage difference.

In the embodiment generally indicated with reference number 21, the through contacts 41 have a general U-form with the open side facing in the direction of the gate runner 25 and the closed-end facing towards the active area 12. Mobile contaminate ions which diffuse along the third oxide layer 30 can be trapped within the U-shape form of the metal through contacts 41. In this embodiment, the U-shaped metal through contacts 41 of one row are offset with respect to those of the neighboring row. Mobile ions which diffuse between two U-shaped through contacts 41 of one row enter the center of the closed-end of the U-shaped through contact 41 of the next row.

In the embodiment indicated generally with reference number 20, a combination of elongated, generally rectangular, metal through contacts 37 and V-shaped through contacts 39 is provided. In this embodiment, the two outermost rows include elongated rectangular metal through contacts 37. The two rows are offset with respect to one another. A third row of V-shaped through contacts 39 is provided on the inner side of the second row of elongated rectangular through context 37. The apex of the V-shaped the metal through contacts 39 is arranged between two metal through contacts 37 of the neighboring row so that all three rows have an offset or staggered arrangement.

Although the embodiments have been described in the context of mobile contaminate cations, that is positively charged mobile ions, the through contacts may also provide a barrier against the diffusion of mobile anions, that is negatively charged ions, such as OH⁻, into the active area. Contamination of negatively charged ions is an issue in p-channel devices.

In further embodiments, three for even more rows of through contacts are provided. Furthermore, any number of rows of metal through contacts having different forms are provided. Also, a single row may include the metal contacts having a variety of shapes in plan view.

In further embodiments, a semiconductor device is provided that comprises a semiconductor substrate comprising an active area and a peripheral region adjacent the active area and structure positioned in the peripheral region for hindering the diffusion of mobile ions from the peripheral region into the active area. This structure may be positioned and comprise material so as to hinder the diffusion of mobile ions along a dielectric layer positioned on the semiconductor substrate and/or to hinder the diffusion of mobile ions through the semiconductor substrate itself into the active region. The mobile ions may be present as a result of substances used in processing the semiconductor substrate and may be mobile as a result of subsequent processing and/or subsequent operation of the device.

FIG. 4 illustrates a portion of a semiconductor device 50 according to an embodiment. The semiconductor device 50 may be a MOSFET or an IGBT, for example. The semiconductor device 50 includes a semiconductor substrate 51 having a first major surface 52, an active area 53 and a peripheral region 54 positioned adjacent the active area 53. A plurality of first trenches 55, each including an electrode 56, is positioned in the active area 53. In this embodiment, the electrode 56 is a gate electrode. The semiconductor device 50 also includes a source electrode which is not illustrated in FIG. 4. The source electrode may be positioned within the first trench 55, whereby it is electrically isolated from the gate electrode 56 by a dielectric layer. The source electrode may also be positioned on the first major surface 51 adjacent the first trenches 55.

Each first trench 55 extends into the semiconductor substrate 51 from the first major surface 52. A dielectric layer 57 is positioned on the first major surface 52 and a source metal contact 58 is positioned on the dielectric layer 57. A plurality of electrically conductive members 59 are positioned in the peripheral region 54 of which one is illustrated in FIG. 4. The electrically conductive members 59 are spatially isolated from one another and extend through the dielectric layer 57 and are in electrical contact with the source metal contact 58. The source metal contact 58 is also in electrical contact with the source electrode and physically contacts the source electrode at a position of the semiconductor device 50 that is not illustrated in the drawings.

The electrically conductive member 59 interrupts the dielectric layer 57 and is configured to be able to hinder the diffusion of mobile ions along and through the dielectric layer 57 and, in particular, the diffusion of mobile cations such as Na⁺ and K⁺ along and through the dielectric layer 57 from the peripheral region 54 into the active area 53. The electrically conductive members 59 provide a mobile cation diffusion barrier.

The electrically conductive member 59 comprises a trench 60 which extends into the semiconductor substrate 51 from the first major surface 52 and a through contact 61 which extends from the source metal contact 58 through the dielectric layer 57 to the trench 60. The trench 60 is defined by four side walls and a base extending between the side walls. The trench 60 is laterally spatially isolated and not connected to the first trenches 55 positioned in the active area 53. The side walls and base of the trench 60 are covered with an oxide layer 62 and filled with electrically conductive material 63. The oxide lining 62 electrically isolates the electrically conductive material 63 from the semiconductor substrate 51.

In this embodiment, the electrically conductive material is polysilicon. However other electrically conductive materials such as metals and alloys may also be used. The electrically conductive material 63 positioned in trench 60 is electrically connected to the source metal contact 58 by the through-contact 61 which extends from the source metal contact 58 through the dielectric layer 57 to the electrically conductive material 63. The through contact 61 and trench 60 have, in plan view, generally the same shape. For example, both the through-contact 61 and trench 60 may have a V-shape. The through-contact 61 may have the same size as the trench 60 or may be laterally smaller and concentrically arranged within the area of the trench defined by the side walls.

The oxide layer 62 lining the second trench 60 extends over the first surface 52 of the semiconductor substrate 51 and also lines the trenches 55 in the active area 53 of the semiconductor device 50. The oxide layer 62 is thinner that the dielectric layer 57 and is positioned between the first major surface 52 of the semiconductor substrate and the dielectric layer 57. The trench 60 in the peripheral region 54 increases the possible diffusion path along this oxide layer 62 for mobile ions diffusing in direction indicated by arrow 64 from the peripheral region 54 to the active area 53 compared to an arrangement in which the oxide layer extends in a single plane on the first major surface of the semiconductor substrate and the through contact 61 blocks the diffusion of mobile ions along the oxide layer 62 from the peripheral region 54 to the active area 53.

Figure 5:
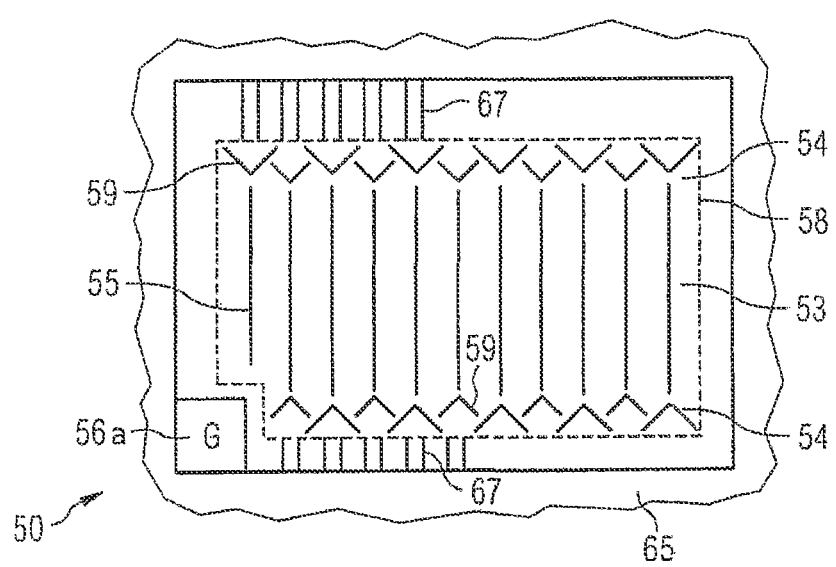
FIG. 5 illustrates a plan view of a semiconductor device.

FIG. 5 illustrates a top view of semiconductor device 50. The active area 53 is approximately rectangular and situated at the center of a semiconductor substrate 51. The plurality of first trenches 55 extend parallel to one another. A peripheral region 54 is positioned on two opposing sides of the active area 53 and, in particular, at the opposing ends of the first trenches 55. The active area 53 is surrounded on all sides by an edge region 65 so that the two peripheral regions 54 are intermediate between the active area 53 and edge region 65.

The source metal contact 58 covers the entire active area 53 and the peripheral regions 54. A gate contact 56a is electrically connected to the gate electrodes 56 in the first trenches 55 and is positioned in one corner of the semiconductor substrate 51. The gate contact 56a is electrically isolated from the source metal contact 58. As can be seen in the top view of FIG. 5, the plurality of electrically conductive members 59 are, in plan view, generally V-shaped. The apex of the V is positioned facing towards the active area 53 and the open side of the V faces towards the edge region 65. In this embodiment, two rows of V-shaped electrically conductive members 59 are provided and the spacing of the V-shaped electrically conductive members 59 of each row is selected such that the electrically conductive members 59 of adjacent rows overlap.

The shape of the electrically conductive members 59 and the trench 60 and through contact 61 in plan view is not limited to a V-shape. The electrically conductive members 59 and the trench 60 and through contact 61 may each have a U-shape or a rectangular shape in plan view.

Figure 6:
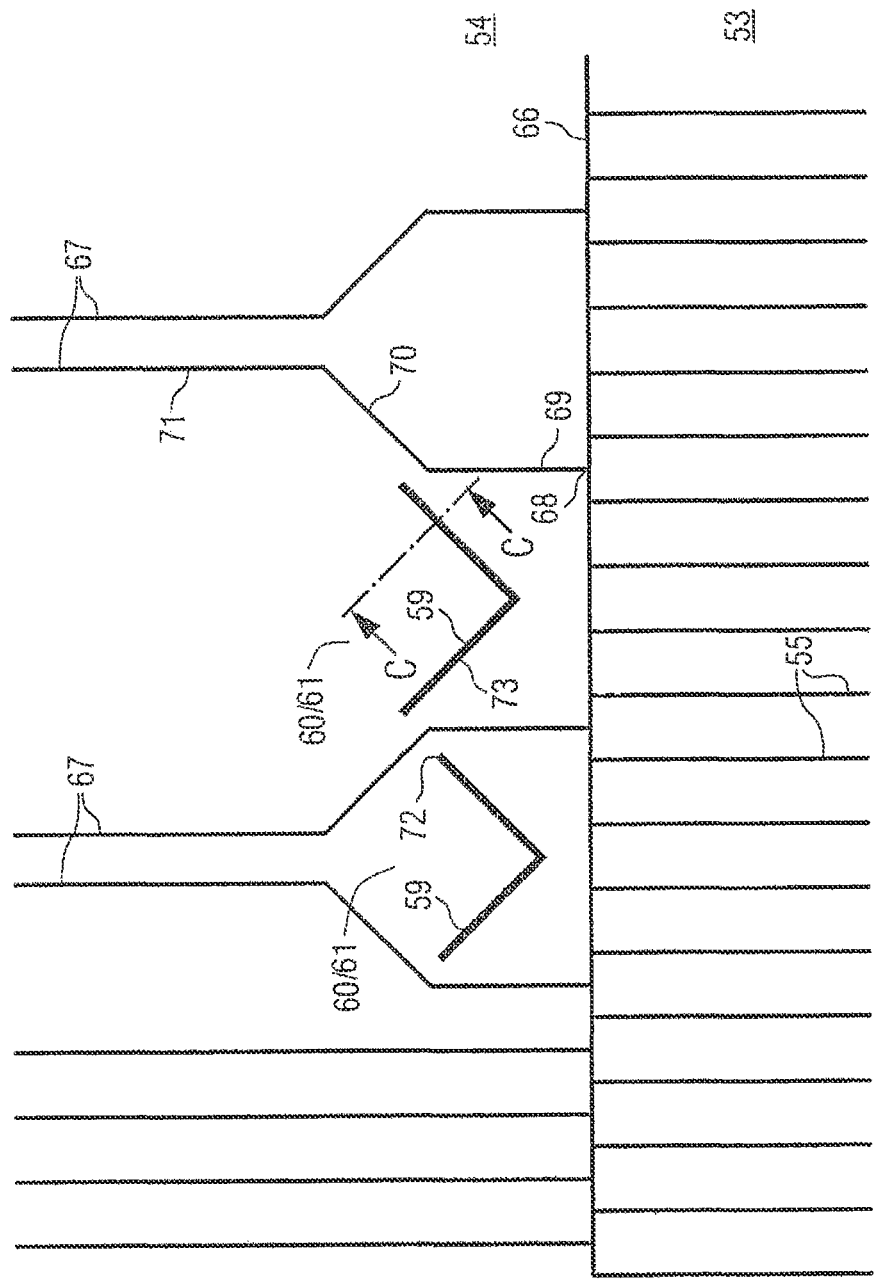
FIG. 6 illustrates an enlarged plan view of the semiconductor device of FIG. 5.

An enlarged plan view of the arrangement of the first trenches 55 and electrically conductive members 59 is illustrated in FIG. 6. The trenches are illustrated with a single line for illustrative purposes only. The plurality of first trenches 55 of the active area 53 are connected to a fourth trench 66, also illustrated by a single line, which extends across the ends of the first trenches 55 in a direction generally perpendicular to the length of the first trenches 55. The fourth trench 66 electrically connects the first trenches 55 together.

In the embodiment illustrated in FIG. 6, a single fourth trench 66 electrically connects all of the first trenches 55 together. However, in further embodiments two or more fourth trenches are provided and each of these fourth trenches may electrically connect separate groups of first trenches together. Each group of first trenches may include two or more first trenches.

Two of the plurality of electrically conductive members 59 are illustrated in FIG. 6. As previously mentioned, the shape of the trench 60 and the through contact 61 which are provided with the electrically conductive member 59 in this embodiment are approximately the same in plan view. The trench 60 and through contact 61 both have the V-shape illustrated in FIG. 6. A single electrically conductive member 59 of two rows is illustrated. The electrically conductive members 59 of the two adjacent rows are arranged offset with respect to one another so that the distal end 72 of one V-shaped electrically conductive member points towards the side face 73 of the neighboring V-shaped electrically conductive member 59.

The peripheral region 54 of the semiconductor device 50 also includes a plurality of third trenches 67 which extend from the fourth trench 66 in a direction generally parallel to the long direction of the first trenches 55 in the active area 53. The plurality of third trenches 67 are electrically connected to the fourth trench 66 and the first trenches 55. The third trenches 67 extend from the fourth trench 66 towards the non-illustrated edge region 65.

The third trenches 67 are arranged so that one end 68 which extends from the fourth trench 66 is positioned laterally off-set from the first trenches 55 of the active area 53. The third trenches 67 extend in a direction parallel to the trenches 55 in a first portion 69 and then extend at an inclined angle in a second region 70 and further extend in a direction parallel to the first trenches 55 in a third region 71. The third trenches 67 are arranged in pairs or groups.

The electrically conductive members 59 are positioned between adjacent third trenches 67 so that a third trench 67 extends between the distal end 72 of the one electrically conductive member 59 and the side face 73 of the neighboring electrically conductive member 59. The third trenches 67 can be thought of as meandering through the plurality of electrically conductive members 59.

The first trenches 55, the fourth trench 66 and the third trenches 67 are electrically connected together and provide an electrically conductive path for the gate electrode 56 positioned in the first trenches 55 in the active area 53 between the electrically conductive members 59 to a non-illustrated gate runner and to the gate metal contact 56a which is positioned peripherally to the electrically conductive members 59. The path provided by the first trenches 55, fourth trench 66 and third trenches 67 is electrically isolated from the electrically conductive members 59 with the second trenches 60 and the source metal contact 58 so that the first, third and fourth trenches may lie at a different potential to that of the second trenches 60, the source electrode and the source metal contact 58.

The electrode 56 positioned in the first trenches 55 and electrically accessible peripherally to the peripheral regions 54 by the third trenches 67 and fourth trenches 66 is not limited to a gate electrode. The structure of the first trenches 55, the fourth trench 66 and the third trenches 67 may be used as a path for any electrode lying at a potential different to that of the electrically conductive members 59, for example a sensor electrode. Different groups of first trenches 55, fourth trenches 66 and third trenches 67 may also be used to provide a plurality of paths, electrically isolated from one another, for carrying signals at a plurality of different potentials from the active area 53 through the mobile ion barrier provided by the electrically conductive members 59 positioned in the peripheral region 54 to the edge region 65.

The peripheral region 54 includes fewer trenches than the active region 53 in order to provide lateral space for accommodating the mobile ion barrier in the form of the electrically conductive members 59. In this embodiment, compared to the first trenches 55, three trenches are omitted between each third trench 67 so that the ratio the number trenches between the active area 53 and the peripheral region 54 is 5 to 2.

The trench 60 of the electrically conductive member 59 can be fabricated during the manufacturing process to fabricate the first trenches 55 of the active area 53 and third trenches 67 in the peripheral area 54.

Figure 7:
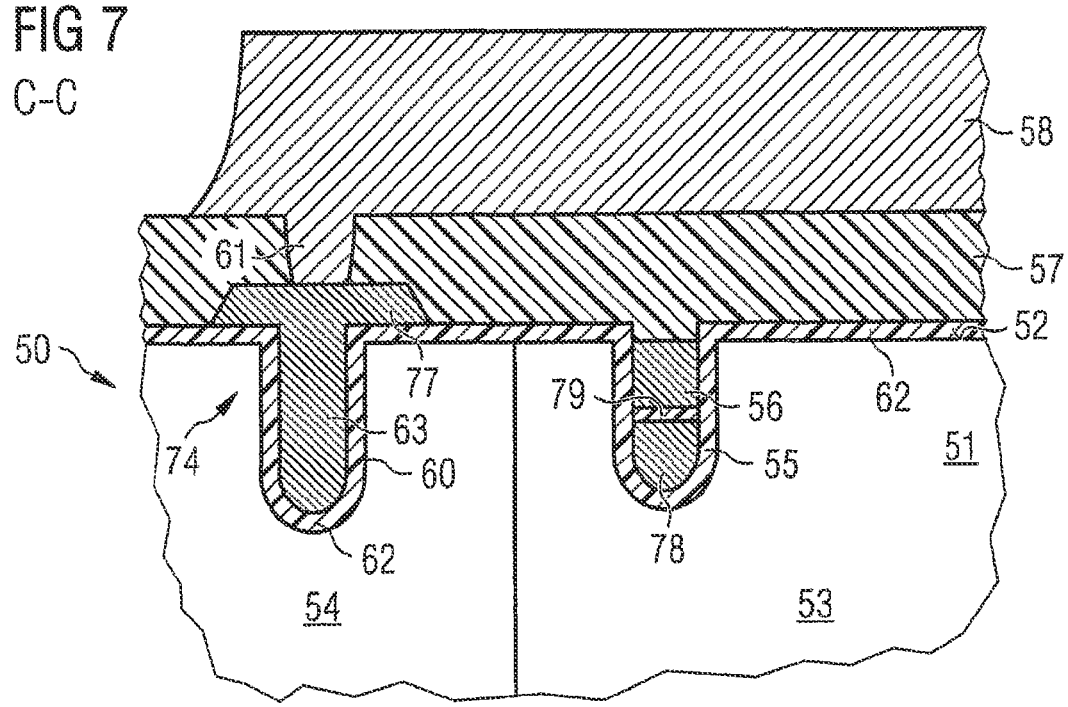
FIG. 7 illustrates a cross-sectional view of a semiconductor device.

The electrically conductive members 59 may have forms other than that illustrated in FIGS. 4 to 6. FIG. 7 illustrates a further embodiment of an electrically conductive member 74 that comprises a trench 60 and a through contact 61. The trench 60 is lined with an oxide layer 62 and filled with electrically conductive material 63. In the embodiment illustrated in FIG. 7, the electrically conductive material 63 which fills the trench 60 extends to regions adjacent the open end of the trench 60 so that it is positioned on the oxide layer 62 in regions of the first surface 52 adjacent the trench 60 to provide a protruding cap 77 of electrically conductive material that is laterally larger than the trench 60.

The dielectric layer 57 extends over the peripheral regions of the cap 77. The through contact 61 extends from the source metal contact 58 through the dielectric layer 57 to the cap 77 provide electrical contact between the source metal contact 58 and the electrically conductive material 63 positioned in the trench 60.

In the embodiment, illustrated in FIG. 7, a source electrode 78 is positioned in the lower portion of the first trench 55, a dielectric layer 79 is positioned on the source electrode and the gate electrode 56 is positioned on the dielectric layer 79. The dielectric layer 79 electrically isolates the source electrode 78 and gate electrode 56 from one another.

Figure 8:
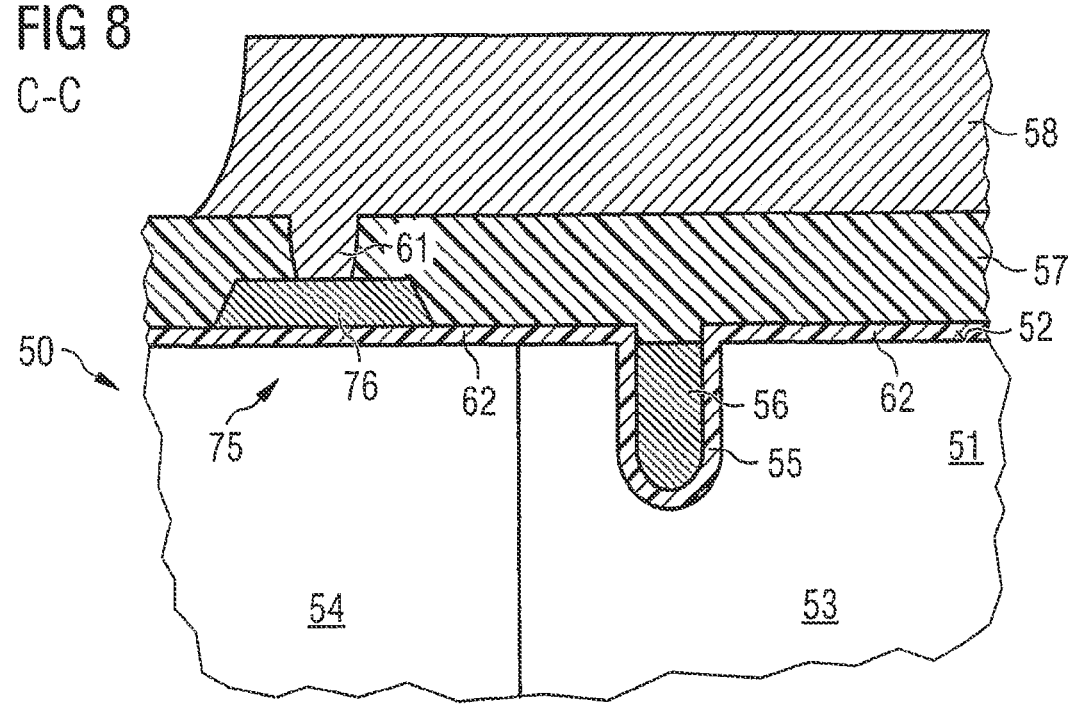
FIG. 8 illustrates a cross-sectional view of a semiconductor device.

FIG. 8 illustrates a further embodiment of an electrically conductive member 75 which has the form of a protrusion 76 positioned on the oxide layer 62 on the first major surface 52. The electrically conductive member 75 does not include a trench. The dielectric layer 57 extends over peripheral regions of the protrusion 76 so that the through contact 61 extends through the dielectric layer 57 to the upper surface of the protrusion 76. The protrusion 76 and the through contact 61 together interrupt the dielectric layer 57 through the entire thickness of the dielectric layer 57 and block the diffusion of mobile ions along the dielectric layer 57.

In embodiments in which the electrically conductive member 59 includes a trench, the trench may have a width and depth which is the same as the width and depth of the first trenches 55 of the active area 53. In other embodiments, the trench of the electrically conductive member 59 may have a different width and depth to those of the first trenches 55 of the active area 53. In one embodiment, the trenches of the electrically conductive member 59 each have a greater width and a greater depth than the width and depth of the first trenches of the active area 53. Increasing the width and depth of the trenches of the electrically conductive member 59 increases the possible diffusion path of mobile ions along the first oxide layer lining the trenches of the electrically conductive members 59 and covering the first major surface 52.

FIG. 9 illustrates a semiconductor device 100. The semiconductor device 100 includes structure for hindering the diffusion of mobile ions through the semiconductor substrate 101 and, in particular, through the semiconductor substrate 101 from the edge region 104 into the active area 103.

The semiconductor device 100 includes a semiconductor substrate 101 having a first major surface 102, an active area 103 and an edge region 104 surrounding the active area 103. The semiconductor device 100 includes at least one trench 105 positioned in the edge region 104 that at least substantially surrounds the active area 103. The wording "at least substantially surrounding" is intended to include embodiments in which a single continuous trench confines and completely encloses the active area as well as embodiments including one discontinuous trench and embodiments in which two or more gaps are provided between trench portions so as to provide discrete trenches separated by gaps. The gap or gaps comprise regions of the semiconductor substrate between ends of adjacent trench portions. The trench 105 is defined by two side walls which are generally parallel and oppose one another, and a base extending between the side walls.

In this embodiment, the trench 105 is filled with dielectric material in the form of an oxide 106. The oxide may be chosen to provide a barrier or getter to prevent mobile ions from diffusing through the semiconductor substrate 101 from the edge region 104 in the direction of the active area 103. The dielectric material 106 may be chosen so as to physically prevent the diffusion of the gettered mobile ions out of the trench 105 or away from the interface of the trench 105 or so that the dielectric material 106 chemically reacts with the mobile ions to form a product which does not diffuse out of the trench 105 and through the semiconductor substrate 101. The mobile ions may be metal ions such as iron, copper and nickel ions.

The mobile ions may be iron ions, such as $Fe^+$ ions, which may diffuse through the semiconductor substrate from the edge region 104 in the direction of the active area 103 during operation of the semiconductor device 100 and may contaminate the active area 103. The mobile ions, in particular iron ions, may diffuse through the semiconductor substrate within a space charge region due to the field enhanced diffusion of the ions.

The mobile ions to be trapped in the trench may be copper or nickel ions which may diffuse through the semiconductor substrate 101 during production of the semiconductor device and may contaminate the active area 103. After the mobile ions have been trapped by the trench, they are no longer able to diffuse through the semiconductor substrate 101 and into the active area 103. The semiconductor device 100 may be a MOSFET, an IGBT or a diode with gate-assisted turn-off, for example.

The trench 105 has a function other than as a junction termination. In an embodiment, the trench 105 should not act as junction termination. Typically, devices have special junction termination such as field rings or field plates enabling a high breakdown voltage of the device. The trench 105 can be located outside the space charge region or within the space charge region.

FIG. 10 illustrates a more detailed view of the position of the trench 105 in the edge region 104 of semiconductor device 100. The active area 103 includes a plurality of active trenches 110, each including a gate electrode 111. The gate electrode may be polysilicon or a metal. A dielectric layer 112 is positioned on the first surface 102 and covers the gate electrode 111. A source metal contact 113 is positioned on the dielectric layer 112 and extends through through-holes in the dielectric layer 112 positioned above the source regions 114 in the semiconductor substrate 101 so as to electrically connect the source regions 114 to the source metal contact 113. The dielectric layer 112 electrically isolates the source metal contact 113 from the gate electrode 111 and the further edge structures such as a field plate 115.

The trench 105 acts as a mobile ion diffusion barrier and may also be described as a mobile ion trap or a mobile ion getter. The trench 105 is positioned in the edge region 104 so that it does not influence the properties of the semiconductor device 100 or of the edge structures measurably. In this context "measurably" is used to describe a deviation from the range of a property defined in the data sheet for a semiconductor device having the same active structures and edge structures, but no trench 105. The trench 105 may be positioned under edge structures such as a field plate 115 for example, so that additional lateral space is not taken up to provide a mobile ion diffusion barrier.

The trench 105 may be positioned in the edge region 104 in the area of a junction termination of the semiconductor device or the trench is positioned between the junction termination and outermost source areas.

FIGS. 11 to 14 illustrate plan views of a trench 105 filled with a dielectric 106, such as an oxide, according to further embodiments. The trench 105 is illustrated as a single line for illustrative purposes though each trench is defined by a base extending between two opposing side walls in the case of a single trench having a continuous loop or four side walls in the case of a discrete trench.

Figure 11:
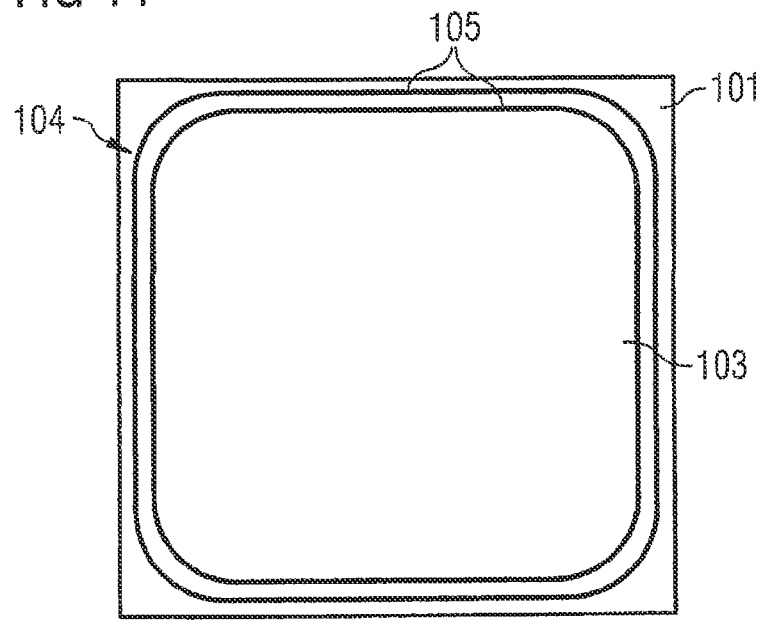
FIG. 11 illustrates a plan view of a semiconductor device.

In the embodiment of FIG. 11, two trenches 105 are provided which are concentrically arranged. Each of the trenches is generally rectangular, continuous and completely confines the active area 103.

Figure 12:
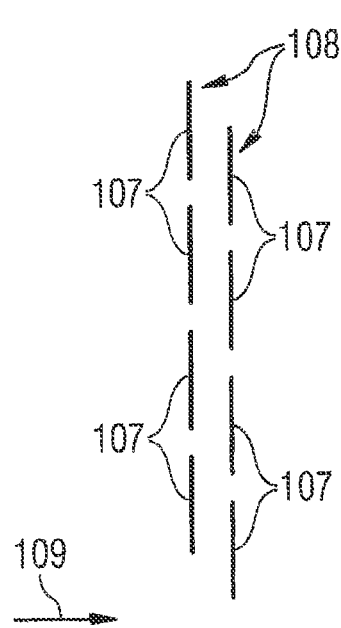
FIG. 12 illustrates a plan view of a trench structure of a semiconductor device.

In the embodiment of FIG. 12, a plurality of discrete trenches 107 making up rows of trenches 108 are provided. Two rows 108 of discrete trenches 107 are provided and are offset from one another so that regions between the discrete trenches of one row 108 are not aligned with regions between the discrete trenches of the other row 108 in the possible direction of iron ion diffusion illustrated with arrow 109.

Figure 13:
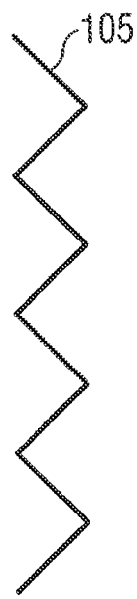
FIG. 13 illustrates a plan view of a trench structure of a semiconductor device.

FIG. 13 illustrates an embodiment for a single continuous trench 105 and a discrete trench 107 in which the trench has a zigzag form when viewed in plan view.

Figure 14:
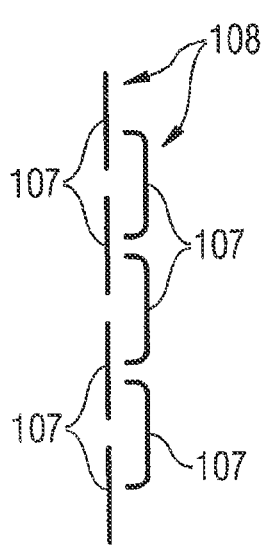
FIG. 14 illustrates a plan view of a trench structure of a semiconductor device.

FIG. 14 illustrates an embodiment in which two rows of discrete trenches 107 are provided. One row has generally rectangular trenches and one row has U-shaped trenches.

The U-shaped trenches are arranged so that the open end of the U faces the edge region of the semiconductor device and the closed end faces the active area. As in the embodiment of FIG. 12, the regions of the semiconductor substrate between discrete trenches of one row are arranged to overlap with the discrete trenches of the adjacent row in the possible direction of iron ion diffusion 109. The possible diffusion path through the semiconductor substrate meanders between the overlapping discrete trenches.

In contrast with the embodiment illustrated in FIGS. 4 to 8, the trench 105 filled with dielectric material of the embodiment illustrated in FIG. 11 is not electrically connected to a further element and can be thought of as floating.

However, in further non-illustrated embodiments the trench and, in particular, the material within the trench may be electrically connected to further elements.

A semiconductor substrate can include one or more diffusion barrier structures for mobile cations which block a possible diffusion path into the active area along a dielectric layer and one or more diffusion barrier structures for iron ions which block a possible diffusion path into the active area through the semiconductor substrate according to one of the embodiments described above.

The semiconductor device 10 is illustrated as a vertical MOSFET device which may operate at a voltage of 20V to 7000V, for example. The MOSFET device may be planar or a trench MOSFET. The through contacts 17 and their arrangement according to one of the embodiments described above may also be used in lateral transistor devices as well as vertical transistor devices such as insulated gate bipolar transistors (IGBT), smart-power semiconductor devices and logic semiconductor devices among others.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
a semiconductor substrate having a first major surface, an active area and a peripheral region positioned adjacent the active area, the active area comprising a plurality of first trenches and an electrode positioned in the first trenches;
at least one dielectric layer positioned on the first major surface;
a plurality of electrically conductive members positioned in the peripheral region, spatially isolated from one another and extending through the dielectric layer; and
a source metal contact deposited above and forming an electrical contact with the plurality of electrically conductive members,
wherein in plan view, the electrically conductive members are generally V-shaped.

2. The semiconductor device of claim 1, wherein the electrically conductive members are arranged in two or more rows.

3. The semiconductor device of claim 2, wherein the electrically conductive members of adjacent rows are offset with respect to one another.

4. The semiconductor device of claim 1, wherein the electrically conductive members are positioned adjacent two opposing sides of the active area.

5. The semiconductor device of claim 1, wherein the electrically conductive members further comprise a plurality of second trenches filled with electrically conductive material, the second trenches extending from the first major surface into the semiconductor substrate.

6. The semiconductor device of claim 5, wherein the second trenches in plan view have a shape corresponding to a shape of the electrically conductive members in plan view.

7. The semiconductor device of claim 1, wherein the electrode positioned in the first trenches is electrically isolated from the electrically conductive members.

8. The semiconductor device of claim 1, wherein the electrode positioned in the first trenches is a gate electrode.

9. A semiconductor device comprising:
a semiconductor substrate having a first major surface, an active area and a peripheral region positioned adjacent the active area, the active area comprising a plurality of first trenches and an electrode positioned in the first trenches;
at least one dielectric layer positioned on the first major surface;
a plurality of electrically conductive members positioned in the peripheral region, spatially isolated from one another and extending through the dielectric layer; and
a source metal contact deposited above and forming an electrical contact with the plurality of electrically conductive members,
wherein the electrically conductive members further comprise a plurality of second trenches filled with electrically conductive material, the second trenches extending from the first major surface into the semiconductor substrate, and
wherein the electrically conductive material protrudes above the first major surface.

10. A semiconductor device comprising:
a semiconductor substrate having a major surface, an active area and a peripheral region positioned adjacent the active area, the active area comprising a plurality of first trenches and an electrode positioned in the first trenches;
at least one dielectric layer positioned on the first major surface;
a plurality of electrically conductive members positioned in the peripheral region, spatially isolated from one another and extending through the dielectric layer; and
a source metal contact deposited above and forming an electrical contact with the plurality of electrically conductive members, wherein the peripheral region further comprises a plurality of third trenches electrically connected to the first trenches.

11. The semiconductor device of claim 10, wherein the first trenches are connected to the third trenches by a fourth trench extending generally perpendicularly to the direction of the first trenches and the third trenches.

12. The semiconductor device of claim 10, wherein the electrically conductive members further comprise a plurality of second trenches filled with electrically conductive material, the second trenches extending from the first major surface into the semiconductor substrate, wherein at least one second trench is arranged between adjacent pairs or groups of third trenches.

13. The semiconductor device of claim 10, wherein, in plan view, the plurality of third trenches are laterally offset with respect to the plurality of first trenches.

14. The semiconductor device of claim 10, wherein, in plan view, at least one third trench meanders between adjacent electrically conductive members.

* * * * *